US011058025B1

(12) United States Patent
    Cheng

(10) Patent No.: US 11,058,025 B1
(45) Date of Patent: Jul. 6, 2021

(54) TWO-STAGE MODULAR SERVER CHASSIS STRUCTURE

(71) Applicant: POLINKE INTERNATIONAL CO., LTD., New Taipei (TW)

(72) Inventor: Chun-Lin Cheng, New Taipei (TW)

(73) Assignee: POLINKE INTERNATIONAL CO., LTD., New Taipei (TW)

( * ) Notice: Subject to any disclaimer, the term of this patent is extended or adjusted under 35 U.S.C. 154(b) by 0 days.

(21) Appl. No.: 16/907,149

(22) Filed: Jun. 19, 2020

(51) Int. Cl.
    *H05K 7/14* (2006.01)
    *G06F 1/18* (2006.01)
    *G06F 1/16* (2006.01)

(52) U.S. Cl.
    CPC ......... *H05K 7/1489* (2013.01); *G06F 1/1679* (2013.01); *G06F 1/183* (2013.01)

(58) Field of Classification Search
    CPC .. H05K 7/1435; H05K 7/1487; H05K 7/1488; H05K 7/1489; H05K 7/18
    USPC .................................................. 361/724–728
    See application file for complete search history.

(56) References Cited

U.S. PATENT DOCUMENTS

| | | | | |
|---|---|---|---|---|
| 6,025,989 A * | 2/2000 | Ayd ........................ | G06F 1/183 | 312/236 |
| 7,535,717 B2 * | 5/2009 | Lai ........................ | G06F 1/181 | 361/727 |
| 8,649,180 B2 * | 2/2014 | Grady ..................... | G06F 1/183 | 361/725 |
| 8,755,192 B1 * | 6/2014 | Schrempp ............ | H05K 7/1495 | 361/736 |
| 9,501,110 B2 * | 11/2016 | Heyd .................... | G11B 33/128 | |
| 9,532,480 B2 * | 12/2016 | Shen ........................ | G06F 1/184 | |
| 10,624,228 B2 * | 4/2020 | Yun ........................ | H05K 7/1489 | |
| 2004/0100775 A1 * | 5/2004 | Baker ................... | G11B 33/128 | 361/724 |
| 2005/0219826 A1 * | 10/2005 | Carlson ................ | G11B 33/128 | 361/724 |
| 2008/0037209 A1 * | 2/2008 | Niazi ...................... | G06F 1/181 | 361/727 |
| 2009/0231806 A1 * | 9/2009 | Lee ......................... | G06F 1/188 | 361/679.58 |

* cited by examiner

*Primary Examiner* — Adrian S Wilson
(74) *Attorney, Agent, or Firm* — Fei-hung Yang

(57) ABSTRACT

A two-stage modular server chassis structure includes a first chassis and a second chassis. A first assembling portion and a second assembling portion are disposed at the front of the first chassis, a first relative assembling portion and a second relative assembling portion of the second assembling portion corresponding to the two first assembling portions are disposed at the rear of the second chassis for connecting and fixing the two first assembling portions and the two first relative assembling portions, and the second assembling portion and the second relative assembling portion, so that the first chassis and the second chassis are integrally formed as a whole.

8 Claims, 7 Drawing Sheets

TWO-STAGE MODULAR SERVER CHASSIS STRUCTURE

BACKGROUND

Technical Field

The present disclosure generally relates to the field of server chassis. More particularly, the present disclosure relates to a two-stage modular server chassis structure for storing a computer host and a disk array module into two chassis sepectively and has a connection means installed between the two chassis, so that the computer host of a different size can be connected to the disk array module of a different size according to user requirements to lower development and manufacture costs as well as storage and deployment costs.

Description of Related Art

In general, a server is installed with a specific configuration in a server cabinet, and the server cabinet has a plurality of racks for stacking different sized servers therein, so that this system can be used to mount and stack a plurality of servers vertically in order to maximize the utility of space. These servers can slide into or out of the racks, and various types of wires such as input/output (I/O) wires, network cables, and electric cables disposed at the front or rear of the rack are connected to the servers, and each server includes one or more computer servers or accommodates one or more computer server components including hardware processing circuits, memory devices, network controllers, disk drivers, cable ports and power supplies.

In the past, many peripherals such as hard disk array modules were mounted onto the rack, and these rack-mount peripherals come with a standard width to fit their insertion into the racks with an industrial standard, so as to allow a large number of rack-mount peripherals to be plugged into a single rack, and these disk array modules are mounted onto the hard disk chassis to form the rack-mount peripherals. In most cases, there is a plurality of hard disks. For example, a hard disk chassis retaining plate stores three trays and each tray accommodates 8 hard disks, so that the hard disk chassis can store 24 hard disks. Therefore, the disk array modules of different quantities and specifications (3.5-inch, 2.5-inch, M.2, NGSFF NF1 (M.2), M.3, EDSFF (Ruler)) will be collocated with different sized hard disk chassis, and the industrial server so used must be changed accordingly, and thus incurring higher development and manufacture costs for the different sizes of the hard disk chassis.

In view of the aforementioned drawbacks of the prior art, the discloser of the present disclosure based on years of experience in the related industry to conduct extensive research and experiment, and finally designed and developed a two-stage modular server chassis structure with a special connection design to achieve the effect of mounting different sized computer hosts into a first chassis of a different size and different sized disk array modules into a second chassis of a different size, so that the first chassis and the second chassis with a modular design can be combined flexibly according to user requirements to lower the development and manufacture costs.

SUMMARY

It is a primary objective of the present disclosure to provide a two-stage modular server chassis structure having a first chassis for installing a computer host and a second chassis for installing a disk array module, and the first and second chassis come with a corresponding connection structure to modularize different sized computer hosts and different sized disk array modules to fit in the first chassis and the second chassis, so that they can be used in any combination as needed to achieve the effect of lowering the development and manufacture costs. In addition, the skillful design of the connection structure can improve the stability of use.

To achieve the aforementioned and other objectives, the present disclosure discloses a two-stage modular server chassis structure, for installing a computer host and a disk array module separately, and this structure capable of connecting and using the computer host of a different size with the disk array module of a different size according to user requirements comprises: a first chassis, comprising a first lower casing and a first upper casing for installing the computer host therein, and the first lower casing being three first retaining walls continuously surrounding a first bottom panel and having a first assembling portion disposed at the front of the two first retaining walls, and a second assembling portion disposed at the front of the first bottom panel; and a second chassis, comprising a second lower casing and a plurality of hard disk brackets, for accommodating the disk array module therein, and the second lower casing having a second retaining wall disposed on two sides of a second bottom panel separately, and the rear of the two second retaining walls having a first relative assembling portion configured to be corresponsive to the first lower casing, and the rear of the second bottom panel having a second relative assembling portion configured to be corresponsive to the first lower casing; thereby, the two first assembling portions and the two first relative assembling portions, and the second assembling portion and the second relative assembling portion can be used to assemble the first chassis and the second chassis as a whole.

In an embodiment of the present disclosure, the first assembling portion comprises a first positioning plate, and the first positioning plate has a plurality of first locking portions and a plurality of first positioning columns relative to the first relative assembling portion, and the first relative assembling portion comprises a bent first embedded plate, and the first embedded plate has a first embedded hole configured to be corresponsive to the first positioning plate, and the first embedded plate has a plurality of first through holes configured to be corresponsive to the first locking portions respectively and a plurality of first positioning notches configured to be corresponsive to the first positioning columns, so that after the first positioning plate is inserted into the first embedded hole, the first positioning columns are latched into the first positioning notches respectively, and the plurality of screws is passed through the first through holes and screwed to the first locking portions respectively. In addition, the first embedded plate has a plurality of second locking portions, and the first positioning plate has a plurality of second through holes configured to be corresponsive to the second locking portions respectively, and the plurality of screws is passed through the second through holes and screwed to the second locking portions respectively. Therefore, the aforementioned connection design can ensure the stability of both sides after the first chassis and the second chassis are connected.

In another embodiment of the present disclosure, the second assembling portion comprises a second bent plate, and the second bent plate has a plurality of third locking portions and a plurality of second positioning notches relative to the second relative assembling portion, and the second relative assembling portion comprises a second positioning plate, and the second positioning plate has a plurality of third through holes configured to be corresponsive to the third locking portions and a plurality of second positioning columns configured to be corresponsive to the second positioning notches to stack the second positioning plate under the second bent plate, so that the second positioning columns are latched into the second positioning notches respectively, and the plurality of screws is passed through the third through holes and screwed to the third locking portions respectively. Therefore, the aforementioned connection design can ensure the stability of the bottom after the first chassis and the second chassis are connected.

In addition, the two-stage modular server chassis structure of the present disclosure further comprises a reinforcing rib, disposed at a position of the first lower casing near the two first assembling portions and the second assembling portion and coupled to the two first retaining walls and the first bottom panel, and the reinforcing rib is concavely stamped from outside to inside. In addition, the first lower casing on a side of the reinforcing rib has a surface designed with a plurality of first bumps stamped thereon and used as reinforcement for stress concentration.

The first lower casing on a side of the reinforcing rib has a surface designed with a plurality of first bumps stamped thereon and used as reinforcement for stress concentration, and the second lower casing also has a surface designed with a plurality of second bumps stamped thereon and used as reinforcement for stress concentration. These bumps are provided for improving the strength of the front edge of the first chassis and the rear edge of the second chassis.

DESCRIPTION OF THE EMBODIMENTS

The accompanying drawings are included to provide a further understanding of the disclosure, and are incorporated in and constitute a part of this specification. The drawings illustrate embodiments of the disclosure and, together with the description, serve to explain the principles of the disclosure.

Figure 1:
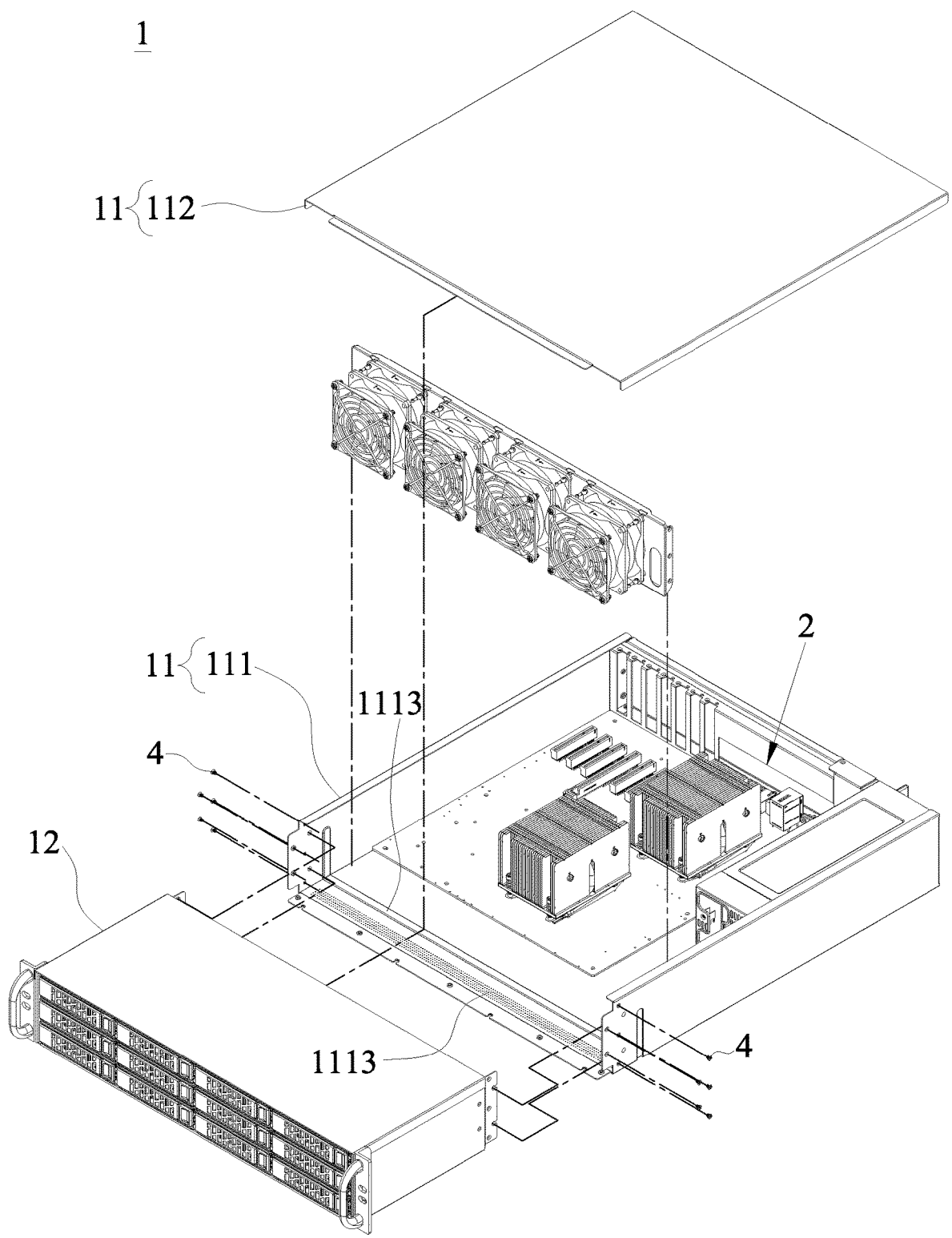
FIG. 1 is a first exploded view of a preferred embodiment of this disclosure.
Figure 2:
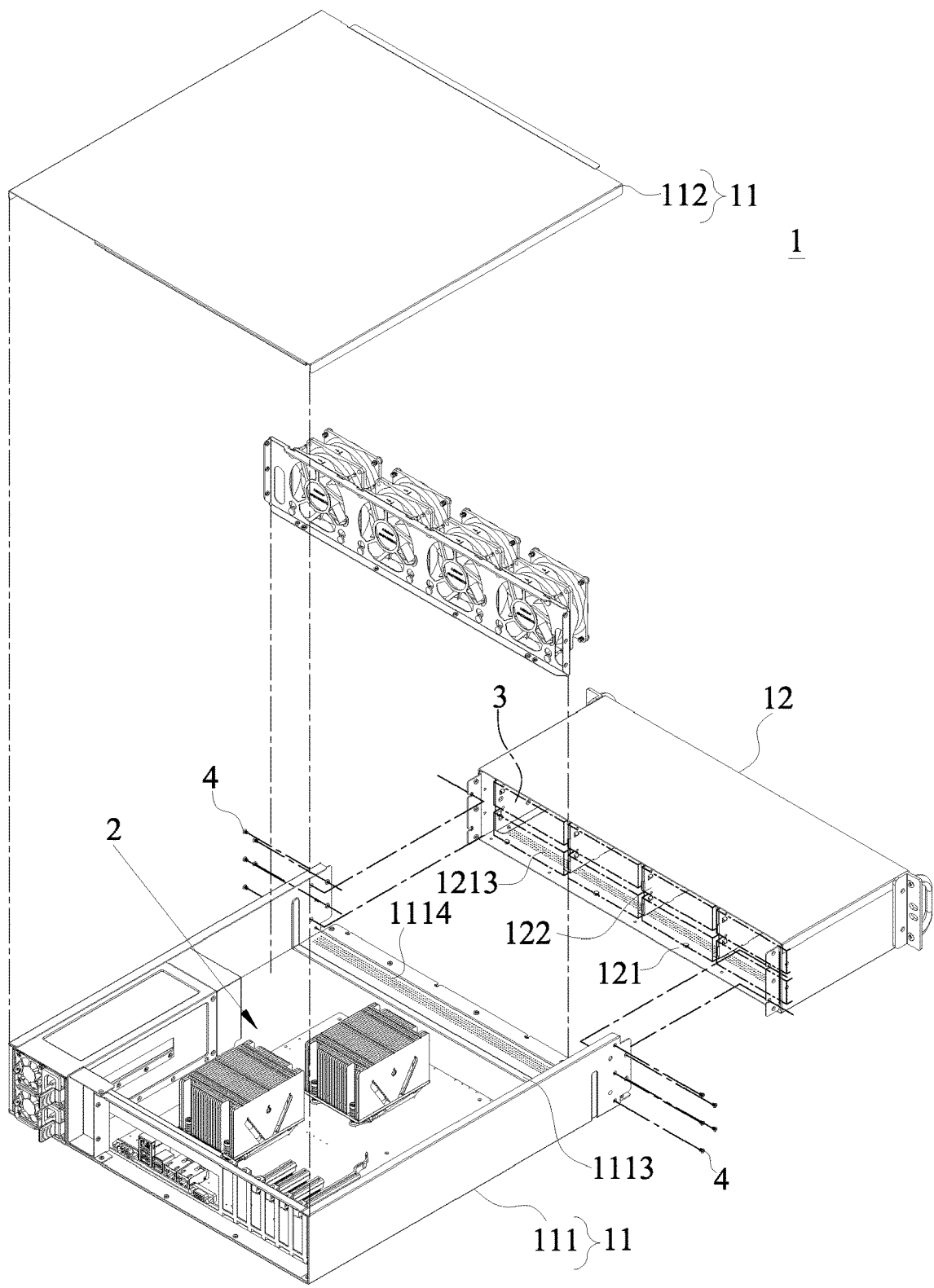
FIG. 2 is a second exploded view of a preferred embodiment of this disclosure.
Figure 3:
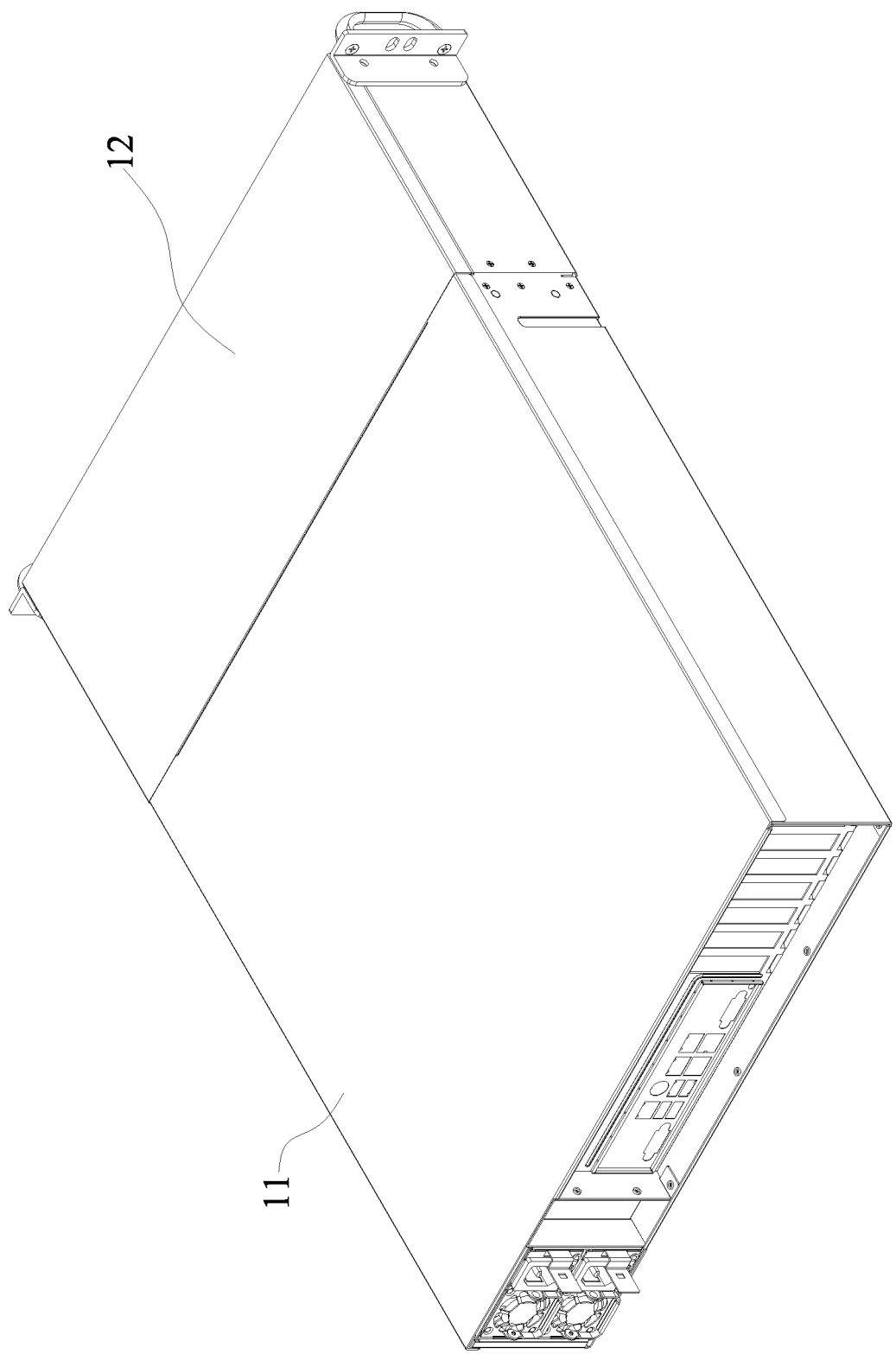
FIG. 3 is a perspective view of a preferred embodiment of this disclosure.
Figure 4A:
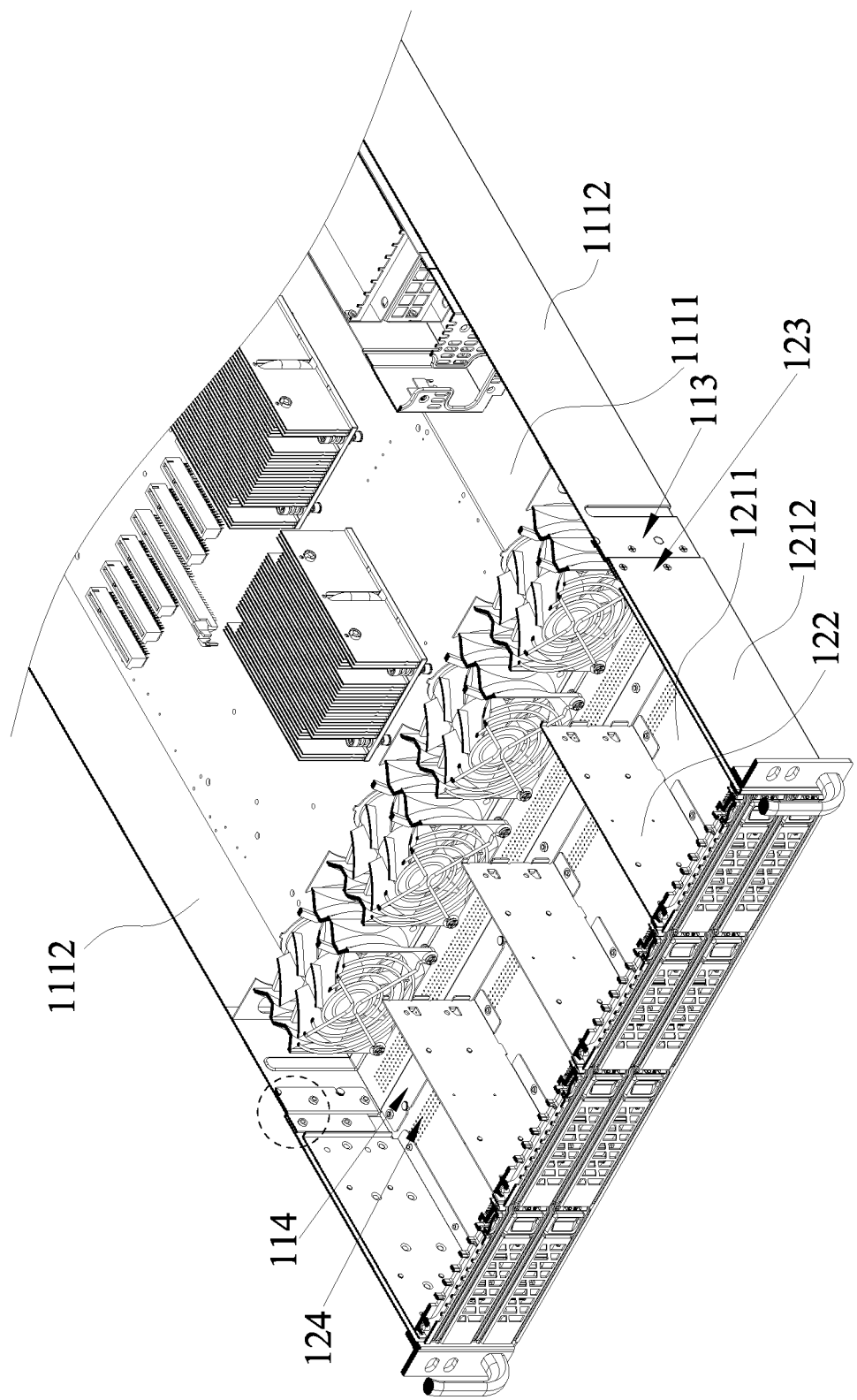
FIG. 4A is a first cross-sectional view of a preferred embodiment of this disclosure.
Figure 4B:
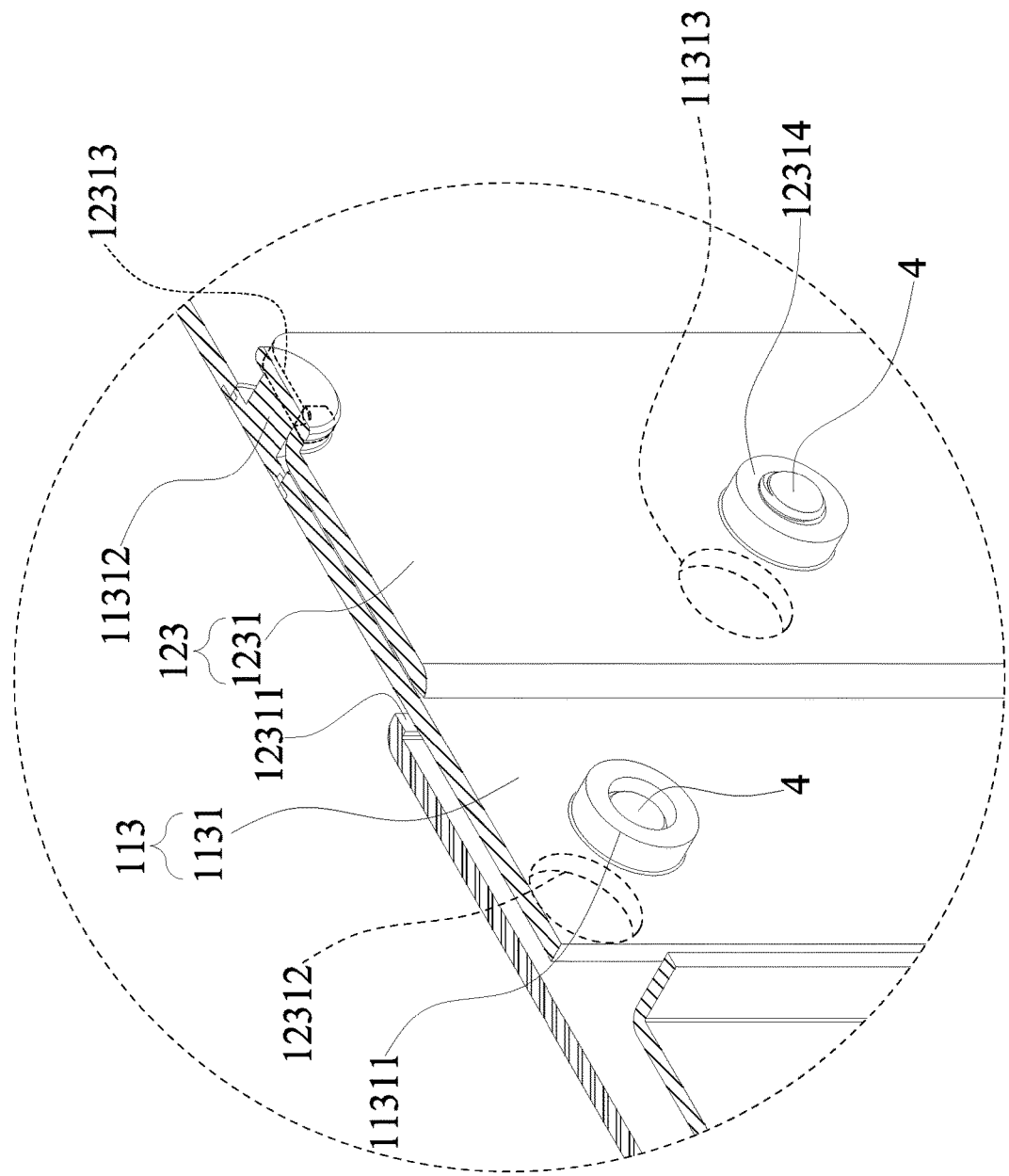
FIG. 4B is a partial blowup view of FIG. 4A.
Figure 5A:
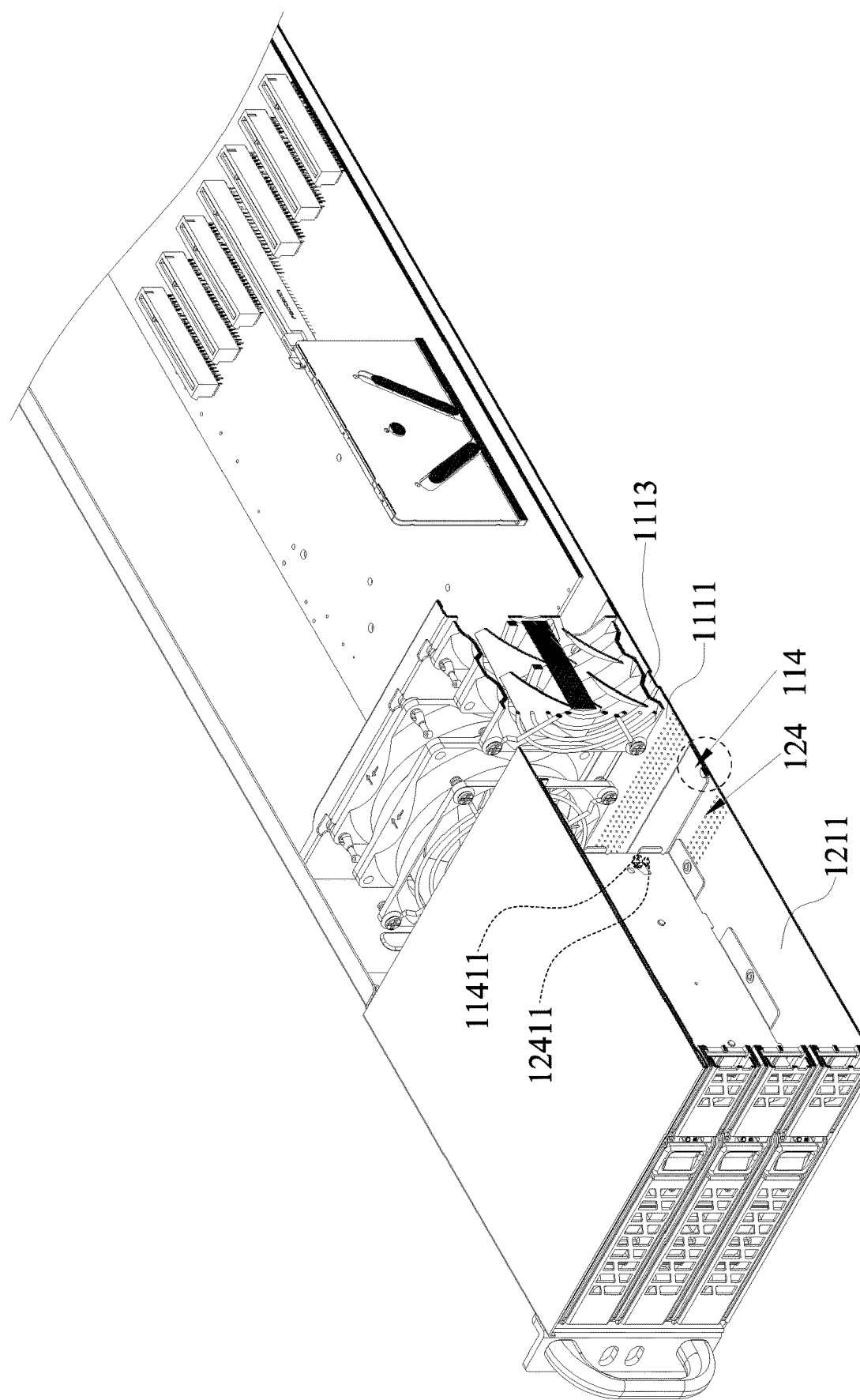
FIG. 5A is a second cross-sectional view of a preferred embodiment of this disclosure.
Figure 5B:
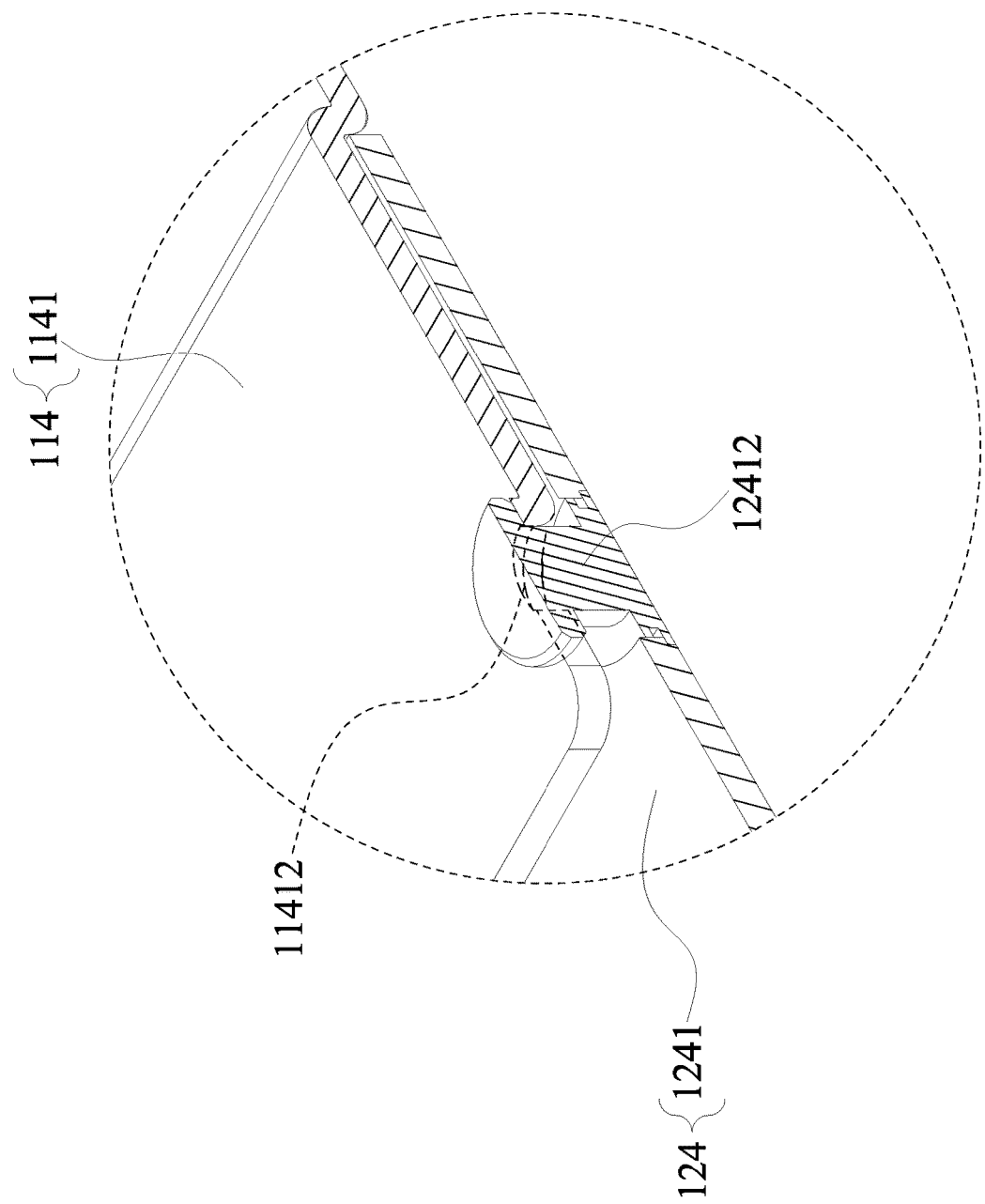
FIG. 5B is a partial blowup view of FIG. 5A.

With reference to FIGS. 1, 2, 3, 4A, 4B, 5A and 5B for the exploded views, perspective view, cross-sectional views and partial blowup views of a two-stage modular server chassis structure in accordance with a preferred embodiment of the present disclosure respectively, the two-stage modular server chassis structure 1 is provided for installing a computer host 2 and a disk array module 3 and capable of connecting and using the computer host 2 of a different size with the disk array module 3 of a different size according to user requirements. The two-stage modular server chassis structure 1 comprises a first chassis 11 and a second chassis 12.

Wherein, the first chassis 11 comprises a first lower casing 111 and a first upper casing 112 for installing the computer host 2 therein, and the first lower casing 111 is formed by three first retaining walls 1112 continuously surrounding a first bottom panel 1111, and a first assembling portion 113 is disposed at the front of the two first retaining walls 1112, and a second assembling portion 114 is disposed at the front of the first bottom panel 1111.

The second chassis 12 comprises a second lower casing 121 and a plurality of hard disk brackets 122 for accommodating the disk array module 3 therein, and the second lower casing 121 has a second retaining wall 1212 disposed on both sides of the second bottom panel 1211 separately, and the rear of the two second retaining walls 1212 has a first relative assembling portion 123 configured to be corresponsive to the first lower casing 111, and the rear of the second bottom panel 1211 has a second relative assembling portion 124 configured to be corresponsive to the first lower casing 111. It is noteworthy that the first assembling portion 113 of this embodiment of the present disclosure comprises a first positioning plate 1131, and the first positioning plate 1131 has a plurality of first locking portions 11311 and a plurality of first positioning columns 11312 relative to the first relative assembling portion 123, and the first relative assembling portion 123 comprises a bent first embedded plate 1231, and the first embedded plate 1231 has a first embedded hole 12311 configured to be corresponsive to the first positioning plate 1131, and the first embedded plate 1231 has a plurality of first through holes 12312 configured to be corresponsive to the first locking portions 11311 respectively and a plurality of first positioning notches 12313 configured to be corresponsive to the first positioning columns 11312 respectively, so that after the first positioning plate 1131 is inserted into the first embedded hole 12311, the first positioning columns 11312 are latched into the first positioning notches 12313 respectively and a plurality of screws 4 is passed through the first through holes 12312 and screwed to the first locking portion 11311. In addition, the first embedded plate 1231 has a plurality of second locking portions 12314, and the first positioning plate 1131 has a plurality of second through holes 11313 configured to be corresponsive to the second locking portions 12314, and the screws 4 are passed through the second through holes 11313 and screwed to the second locking portions 12314. The second assembling portion 114 comprises a second bent plate 1141, and the second bent plate 1141 has a plurality of third locking portions 11411 and a plurality of second positioning notches 11412 relative to the second relative assembling portion 124, and the second relative assembling portion 124 comprises a second positioning plate 1241, and the second positioning plate 1241 has a plurality of third through holes 12411 configured to be corresponsive to the third locking portions 11411 respectively and a plurality of second positioning columns 12412 configured to be corresponsive to the second positioning notches 11412 respectively. After the second positioning plate 1241 is stacked under the second bent plate 1141, the second positioning columns 12412 are latched into the second positioning notches 11412 respectively, and the screws 4 are passed through the third through holes 12411 and screwed to the third locking portions 11411. Since the strength of the first lower casing is insufficient before it is connected and fixed, therefore the two-stage modular server chassis structure 1 of the present disclosure further comprises a reinforcing rib 1113 installed the first lower casing 111 near the two first assembling portions 113 and the second assembling portion 114 to prevent deformation and damage, wherein the reinforcing rib 1113 is coupled to the two first retaining walls 1112 and the first bottom panel 1111, and the reinforcing rib 1113 is concavely stamped from outside to inside. In addition, the first lower casing 111 on a side of the reinforcing rib 1113 has a surface stamped with a plurality of first bumps 1114, and the second lower casing 121 also has a surface stamped with a plurality of second bumps 1213 which are configured to be corresponsive to the first bumps 1114 respectively, so as to serve as reinforcement for stress concentration.

In the present disclosure, the first chassis 11 and the second chassis 12 are combined as a whole by using the two first assembling portions 113 and the two first relative assembling portions 123, and the second assembling portion 114 and the second relative assembling portion 124, so as to achieve the effect of installing different sized computer hosts 2 in different sized first chassis 11 and different sized disk array modules 3 into different sized second chassis 12, so that the first chassis 11 and the second chassis 12 with a modular design allows system manufacturer to increase the number of their combinations and reduce the number of sizes for the development of different models and the burden of inventory to meet the market requirements for the small amount of diversified products. In addition, the two-stage modular server chassis structure can be combined freely according to user requirements to lower development and manufacture costs, and the design of the connection structure of the present disclosure has the effect of improving the stability of the structure.

What is claimed is:

1. A two-stage modular server chassis structure, for installing a computer host and a disk array module separately, and capable of connecting and using the computer host of a different size with the disk array module of a different size according to user requirements, comprising:
   a first chassis, comprising a first lower casing and a first upper casing for installing the computer host therein, and the first lower casing being formed by three first retaining walls continuously surrounding a first bottom panel and having a first assembling portion disposed at the front of the two first retaining walls, and a second assembling portion disposed at the front of the first bottom panel; and
   a second chassis, comprising a second lower casing and a plurality of hard disk brackets, for accommodating the disk array module therein, and the second lower casing having a second retaining wall disposed on two sides of a second bottom panel separately, and a rear of the two second retaining walls having a first relative assembling portion configured to be corresponsive to the first lower casing, and a rear of the second bottom panel having a second relative assembling portion configured to be corresponsive to the first lower casing;
   thereby, the two first assembling portions and the two first relative assembling portions, and the second assembling portion and the second relative assembling portion can be used to assemble the first chassis and the second chassis as a whole.

2. The two-stage modular server chassis structure as claimed in claim 1, wherein the first assembling portion comprises a first positioning plate, and the first positioning plate has a plurality of first locking portions and a plurality of first positioning columns relative to the first relative assembling portion, and the first relative assembling portion comprises a bent first embedded plate, and the first embedded plate has a first embedded hole configured to be corresponsive to the first positioning plate, and the first embedded plate has a plurality of first through holes configured to be corresponsive to the first locking portions respectively and a plurality of first positioning notches configured to be corresponsive to the first positioning columns, so that after the first positioning plate is inserted into the first embedded hole, the first positioning columns are latched into the first positioning notches respectively, and the plurality of screws is passed through the first through holes and screwed to the first locking portions respectively.

3. The two-stage modular server chassis structure as claimed in claim 2, wherein the first embedded plate has a plurality of second locking portions, and the first positioning plate has a plurality of second through holes configured to be corresponsive to the second locking portions respectively, and the plurality of screws is passed through the second through holes and screwed to the second locking portions respectively.

4. The two-stage modular server chassis structure as claimed in claim 1, wherein the second assembling portion comprises a second bent plate, and the second bent plate has a plurality of third locking portions and a plurality of second positioning notches relative to the second relative assembling portion, and the second relative assembling portion comprises a second positioning plate, and the second positioning plate has a plurality of third through holes configured to be corresponsive to the third locking portions and a plurality of second positioning columns configured to be corresponsive to the second positioning notches to stack the second positioning plate under the second bent plate, so that the second positioning columns are latched into the second positioning notches respectively, and the plurality of screws is passed through the third through holes and screwed to the third locking portions respectively.

5. The two-stage modular server chassis structure as claimed in claim 1, further comprising a reinforcing rib disposed at a position of the first lower casing near the two first assembling portions and the second assembling portion and coupled to the two first retaining walls and the first bottom panel.

6. The two-stage modular server chassis structure as claimed in claim 5, wherein the reinforcing rib is concavely stamped from outside to inside.

7. The two-stage modular server chassis structure as claimed in claim 6, wherein the first lower casing on a side of the reinforcing rib has a surface designed with a plurality of first bumps stamped thereon and used as reinforcement for stress concentration.

8. The two-stage modular server chassis structure as claimed in claim 7, wherein the second lower casing also has a surface designed with a plurality of second bumps stamped thereon corresponding to the first bumps and used as reinforcement for stress concentration.

* * * * *